US006863079B2

(12) United States Patent
You et al.

(10) Patent No.: US 6,863,079 B2
(45) Date of Patent: Mar. 8, 2005

(54) SEMICONDUCTOR WAFER WASHING SYSTEM AND METHOD OF SUPPLYING CHEMICALS TO THE WASHING TANKS OF THE SYSTEM

(75) Inventors: Dong-Jun You, Yongin (KR); Jong-Woon Oh, Suwon (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 412 days.

(21) Appl. No.: 09/956,459

(22) Filed: Sep. 20, 2001

(65) Prior Publication Data

US 2002/0092547 A1 Jul. 18, 2002

(30) Foreign Application Priority Data

Jan. 12, 2001 (KR) .......................................... 2001-1732

(51) Int. Cl.⁷ ................................................ B08B 3/00
(52) U.S. Cl. ................... 134/94.1; 134/104.1; 134/155; 134/186; 134/902
(58) Field of Search .............................. 134/94.1, 95.1, 134/99.1, 100.1, 155, 186, 902, 104.1

(56) References Cited

U.S. PATENT DOCUMENTS 4,899,767 A * 2/1990 McConnell et al. ...... 134/56 R
4,917,123 A * 4/1990 McConnell et al. ....... 134/95.2
4,984,597 A * 1/1991 McConnell et al. ....... 134/95.2
6,092,539 A * 7/2000 Chang et al. ............. 134/57 R
6,192,902 B1 * 2/2001 Makita et al. ............... 134/113
6,463,941 B1 * 10/2002 Takita ...................... 134/57 R

* cited by examiner

Primary Examiner—Alexander Markoff
(74) Attorney, Agent, or Firm—Volentine Francos & Whitt PLLC

(57) ABSTRACT

A semiconductor wafer washing system can execute a method in which the washing solution is quickly changed over and over again without the need to alter the structure of the system. The wafer washing system includes a washing solution supply section in which a plurality of chemicals are stored separately, and from which selected ones of the chemicals can be supplied in a predetermined ratio into a washing tank. A circulation section includes circulation piping connected to the washing tank for circulating the washing solution to and from the tank. A discharge section selectively discharges residual chemicals or washing solution from the washing solution supply section, the washing tank and the circulation section. A controller controls the flow of chemicals and washing solution in the washing solution supply section, the circulation section and the discharge section, respectively.

6 Claims, 6 Drawing Sheets

SEMICONDUCTOR WAFER WASHING SYSTEM AND METHOD OF SUPPLYING CHEMICALS TO THE WASHING TANKS OF THE SYSTEM

BACKGROUND OF THE INVENTION

1. Field of the Invention

The present invention relates to the washing of semiconductor wafers to remove impurities or particles from the wafers during the manufacturing of semiconductor devices. More particularly, the present invention relates to a semiconductor wafer washing system and to a method of supplying chemicals to the washing tanks thereof to produce a washing solution.

2. Description of the Related Art

Semiconductor devices are generally made by forming at least one circuit pattern on a wafer through repeated and selected processes such as photoresist patterning, etching, washing, diffusion, and metal deposition processes. The washing process is performed to remove various types of particles and impurities that have been produced during the previous processes so that such particles and impurities do not affect the subsequent processes. For instance, the etching away of a patterned photoresist can produce particles of polymer. The wafer is washed after the etching process to remove the particles.

The density, quantity, and temperature of the washing solution must be established and controlled on the basis of various parameters, such as the manufacturing processes involved, the type of wafer, and the like. To meet such requirements, the washing apparatus has various kinds of sensors, including an optical sensor, to provide feedback for the control of the chemical characteristics, the quantity and temperature of the washing solution, etc. The general structure and operation of a conventional washing apparatus will now be described with reference to FIGS. 1 and 2.

A plurality of wafers W are transferred with a cassette K to the apparatus (ST10) where they are positioned in a loading zone 10 (ST12). Then, the cassette K and wafers W are transferred to an aligner 12 in which the wafers are arranged (ST14) with their flat zones (not shown) aligned at a reference position in the cassette. Subsequently, the cassette K and the wafers W are transferred to a first transfer station 16 by a transfer device 14 (ST16).

The first transfer station 16 confirms the number of the wafers W (ST18) and, at the same time, transfers the wafers from the cassette K (ST20) to a robot 18 having a robot chuck (ST22). The cassette K is then transferred by the transfer device 14 to a stand-by area 20 and, after a predetermined period of time, is placed at a second transfer station 26 (ST24)(ST26). The wafers are then successively transferred by the robot 18 into a plurality of washing tanks 22 containing washing solution (ST28).

The wafers W are submerged in the washing solution by the robot so that impurities on the wafers W are washed away by the washing solution. The wafers W are then transferred by the robot 18 to a drying station 24 where the wafers W are dried (ST30). The wafers W are then transferred by the robot 18 to the second transfer station 26. The second transfer station 26 arranges the wafers W again and confirms whether the same number of wafers W that arrived at the first transfer station 16 have undergone the washing process (ST32).

The cassette K is transferred from the stand-by area 20 to the second transfer station 26 prior to the arrival of the wafers W. The second transfer station 26 loads the wafers W back onto the cassette K that has been so transferred from the stand-by area 20 to the second transfer station 26 (ST34). In this way, the wafers W and cassette K are continuously unloaded and transferred to a position in preparation for the next process (ST36).

As was mentioned previously, the conditions of the washing solution in each of the washing tanks 22, i.e., the concentration, quantity, temperature, etc. must be maintained constant according to the type of wafer W or process that dictates the need for cleaning the wafers W. Accordingly, when a new type of wafer is to be washed, a new type of washing solution must be used. It is difficult to create new environments that facilitate the cleaning of new types of wafers with new cleaning solutions. In addition, the old type of washing solution must be discharged out of the system regardless of the remaining useful life thereof, and the washing tanks 22 and washing solution supply 28 must be thoroughly cleaned before they are to accommodate the new type of washing solution. This process of changing the washing solution requires a lot of time.

In addition, the process also suffers from inefficiency because effort must be spent in converting the apparatus to provide for the new washing solution conditions. For instance, the new washing conditions may require additional washing tanks 22 to be provided in the washing apparatus. Due to space considerations, this sometimes requires the removal of existing elements, including the washing tanks 22, from the apparatus and the addition of completely new washing elements. Changing the existing tanks also requires a lot of time.

As an alternative to modifying the washing apparatus, a completely new washing system may be provided in the production line. However, this may require reducing the size of the existing line or the new washing system might be just too large to incorporate into the existing line. In addition, fabricating and installing a completely new washing system is much more expensive in terms of material and labor than merely modifying the existing washing system.

As is also apparent from the description above, the elements of the washing apparatus are arranged in line so that the wafers can be cleaned in a continuous operation. As shown in FIG. 3, the washing solution, which comprises a mixture of chemicals, is supplied to the washing tanks 22 through a pipeline of a washing solution supply 28. The efficacy of the washing solution is reduced as the washing solution undergoes chemical reactions with the impurities on the wafers W. Therefore, the washing solution is discharged out of the system after a predetermined period of time so that pure washing solution can be introduced into the tanks 22. Nonetheless, it is difficult to maintain the required concentration of the washing solution even when a plurality of washing tanks are provided.

Moreover, the period of refreshing the washing solution is relatively short. Thus, the conventional method suffers from a drawback in terms of the costs associated with the amount of washing solution that must be used.

SUMMARY OF THE INVENTION

An object of the present invention is to provide a semiconductor wafer washing system and method by which washing solution can be changed and/or the washing solution can be conditioned in a short period of time without altering the basic structure and arrangement of the existing washing tanks.

Another object of the present invention is to provide a semiconductor wafer washing system and method by which the washing solution can be conserved, whereby the system is environmentally friendly and economical to use.

Still another object of the present invention is provide a semiconductor wafer washing system and method by which the washing tanks can be flushed in such a way as to quickly facilitate the use of a new form of washing solution.

In order to accomplish these objects, the washing system according to the present invention comprises a washing solution supply section that includes a plurality of chemical storage tanks in which a plurality of chemicals are stored, respectively, and supply piping connected to the chemical storage tanks, a washing tank that receives the chemicals from the washing solution supply section via the supply piping, and a discharge section having a drain and discharge piping that allows residual chemicals and/or washing solution to be discharged from various parts of the system to the drain. The washing system may also comprise a circulation section and a washing solution storage section. The circulation section includes circulation piping connected to the washing tank and through which piping washing solution is circulated from and back to the tank to enhance the mixing of the chemicals constituting the washing solution. The washing solution storage section has one or more washing solution storage tanks connected to the washing tank and circulation piping for storing washing solution used to replenish and/or flush the washing tank and circulation piping.

Furthermore, each of the sections of the semiconductor washing system includes flow control means for controlling the flow of chemicals or washing solution. A controller is operatively connected to the flow control means of each section of the system so as to issue control signals that regulate the flow of the chemicals or washing solution to and from the sections of the system as conditions warrant. The controller may comprise a central processing unit (CPU) or individual processing units provided in the sections of the semiconductor washing system, respectively.

For instance, the flow control means of the washing solution supply section comprises flow control valves disposed in the supply piping. The controller controls the flow control means of the washing solution supply section such that selected ones of the chemicals are supplied to the washing tank in a predetermined ratio. Likewise, the flow control means of the discharge section may comprise flow control valves disposed in the discharge piping. The controller controls these flow control valves such that washing solution is discharged from the washing tank in various instances. On the other hand, the flow control means of the circulation section comprises a variable output pump and/or a flow control valve disposed in the circulation piping. Also, a pressure gauge may be provided for monitoring the pressure of the washing fluid flowing through the circulation piping so that the pump may be feed-back controlled by the controller. The flow control means of the washing solution storage section comprises a purge gas supply system for introducing purge gas into the at least one washing solution storage tank and/or a variable output pump to force washing solution from the washing solution storage tank(s) into the washing tank and circulation piping. A flow control valve of the purge gas supply system and/or the pump is/are controlled by the controller.

In addition to enhancing the mixing of the chemicals constituting the washing solution, the circulation section is used to condition the washing solution. To this end, one or more filters are provided in the circulation piping for filtering impurities from the washing solution. In addition, a heat exchanger is provided in a heat-exchanging relationship with the circulation piping so that the washing solution can be maintained at a desired temperature.

Preferably, the washing solution supply section also includes a quantitative supply part for mixing precise amounts of the chemicals together before the chemicals are dispensed to the washing tank. The quantitative supply part includes at least one mixing tub connected to the washing tank, a cover covering the mixing tub so as to form a mixing tank therewith, a level sensor for sensing the level of chemicals in the tub and issuing a signal indicative of the level of chemicals in the tub tot he controller, and a purge gas supply system for introducing purge gas into the covered tub and/or a variable output pump for forcing the mixture of chemicals from the mixing tub and into the washing tank.

In this case, the flow control means of the discharge section includes elements associated with the quantitative supply part. Specifically, the flow control means of the discharge section will comprise a discharge guide pipe(s) extending into the mixing tub, and driving means for raising and lowering the discharge guide pipe(s) such that an end thereof is positionable at a desired level within the mixing tub. The driving means may be any known linear driving mechanism appropriate for moving the guide pipe between two end limit positions and keeping the guide pipe temporarily fixed in place at the desired position, in response to a signal issued by the controller on the basis of information received from the level sensor.

In order to accomplish the above-mentioned objects of the present invention, the semiconductor wafer washing method includes steps of supplying chemicals from respective ones of the chemical storage tanks into the washing tank in a predetermined ratio to produce an original washing solution in the washing tank, circulating the washing solution from a supplementary part of the washing tank back into a main part of the washing tank to facilitate the mixing of the chemicals constituting the washing solution, subsequently submerging semiconductor wafers into the washing solution in the washing tank to thereby wash the wafers, and draining washing solution circulating from the supplementary part of the washing tank back to the main part of the washing tank.

The supplying of the chemicals from the chemical tanks into the washing tank can be carried out with an enhanced degree of precision by using the quantitative supply part as follows. The chemicals are first supplied at rates regulated by the controller into the mixing tank. During this time, the level of the chemicals in the mixing tank is measured and the flow of chemicals from the mixing tank to the washing tank is cut off. The end(s) of the discharge guide pipe(s) are positioned in the mixing tank, and once the level of the chemicals in the mixing tank exceeds a predetermined level, the discharge guide pipe(s) is/are opened to the drain. Accordingly, pressure in the mixing tank created by purge gas discharges an excess of the mixture of chemicals from the mixing tank through the discharge guide pipe and to the drain. Then, the mixture of chemicals are allowed to flow from the mixing tank to the washing tank.

As was mentioned above, as the washing solution is being circulated from the supplementary part of the washing tank back to the main part of the washing tank, the washing solution is conditioned. The washing solution is filtered and the temperature of the washing solution is adjusted, if necessary.

Manufacturing requirements may dictate that a new form of the washing solution be used to wash a batch of wafers. In this case, the original washing solution is drawn from the washing tank into a washing solution storage tank after the first batch of wafers have been washed. Subsequently, chemicals from respective ones of the chemical storage tanks are supplied into the main part of the washing tank in a new ratio to produce a new form of washing solution in the washing tank. Alternatively, the new form of washing solution can be taken from another one of the washing solution storage tanks, if such washing solution has, for example, already been produced by the washing solution supply section and has been (used and then) stored.

In addition, the washing tank and the circulation piping should be flushed prior to introducing a new form of the washing solution into the washing tank, to thereby eliminate remnants of the original washing solution that would otherwise alter the composition of or otherwise contaminate the new washing solution. Basically, this process entails supplying a cleaning washing solution into the washing tank after the original washing solution has been drawn into the washing solution storage tank and before the chemicals constituting the new form of washing solution have been supplied into the washing tank. Then, the cleaning washing solution is circulated between the main and supplementary parts of the washing tank to thereby clean the washing tank. Finally, the cleaning washing solution is drained.

The cleaning washing solution can come from one of the washing storage solution tanks. Alternatively, the cleaning washing solution can come directly from the chemical storage tanks. In either of these cases it is most effective if the cleaning washing solution has the same composition as the new washing solution that is to be used next.

In any case, the washing solution that is drained in the course of its circulating from the supplementary part of the washing tank back to the main part of the washing tank is temporarily stored. The temporarily stored washing solution is then diluted and discharged from the system.

DETAILED DESCRIPTION OF THE PREFERRED EMBODIMENTS

Figure 1:
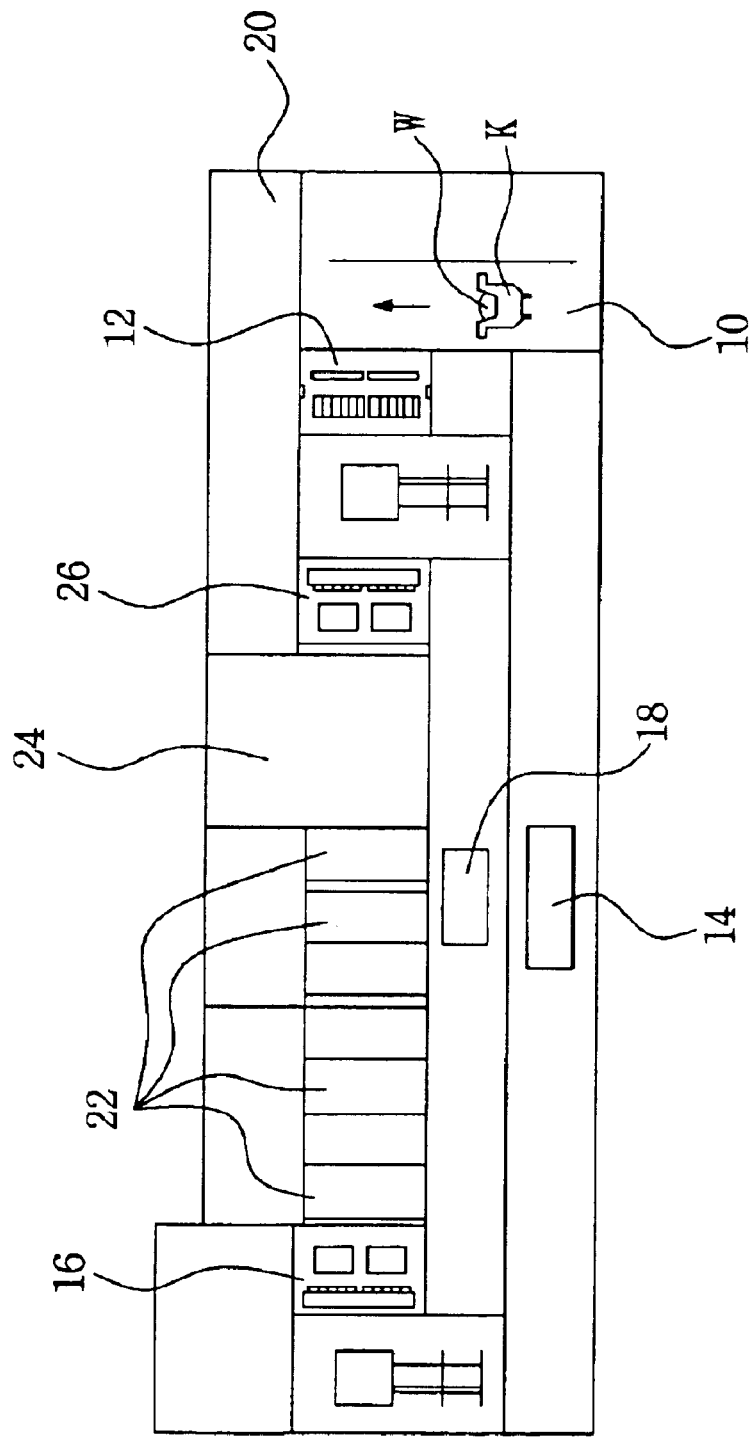
FIG. 1 is a schematic diagram of a conventional washing apparatus.
Figure 2:
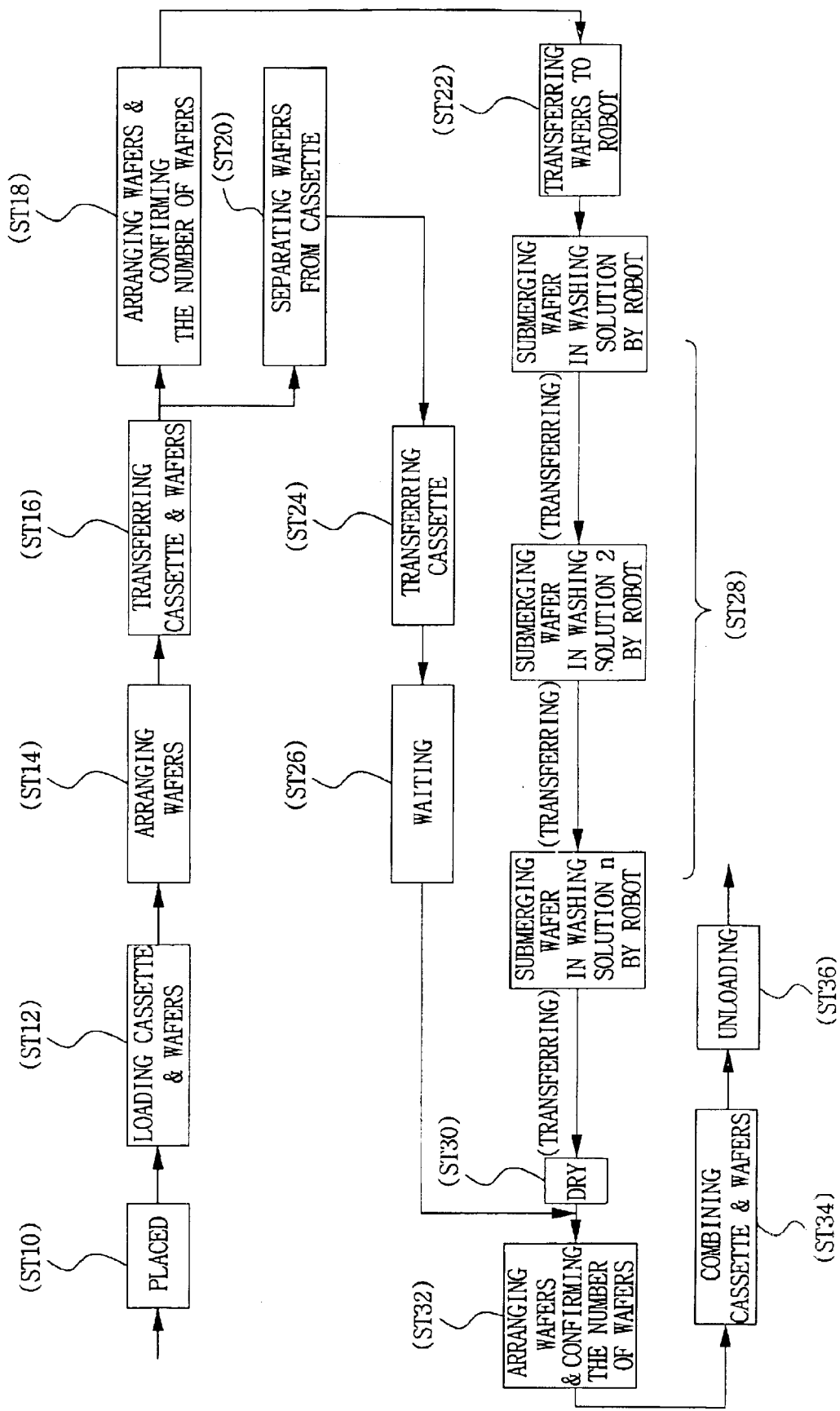
FIG. 2 is a flow chart of the operation of the washing apparatus shown in FIG. 1.
Figure 3:
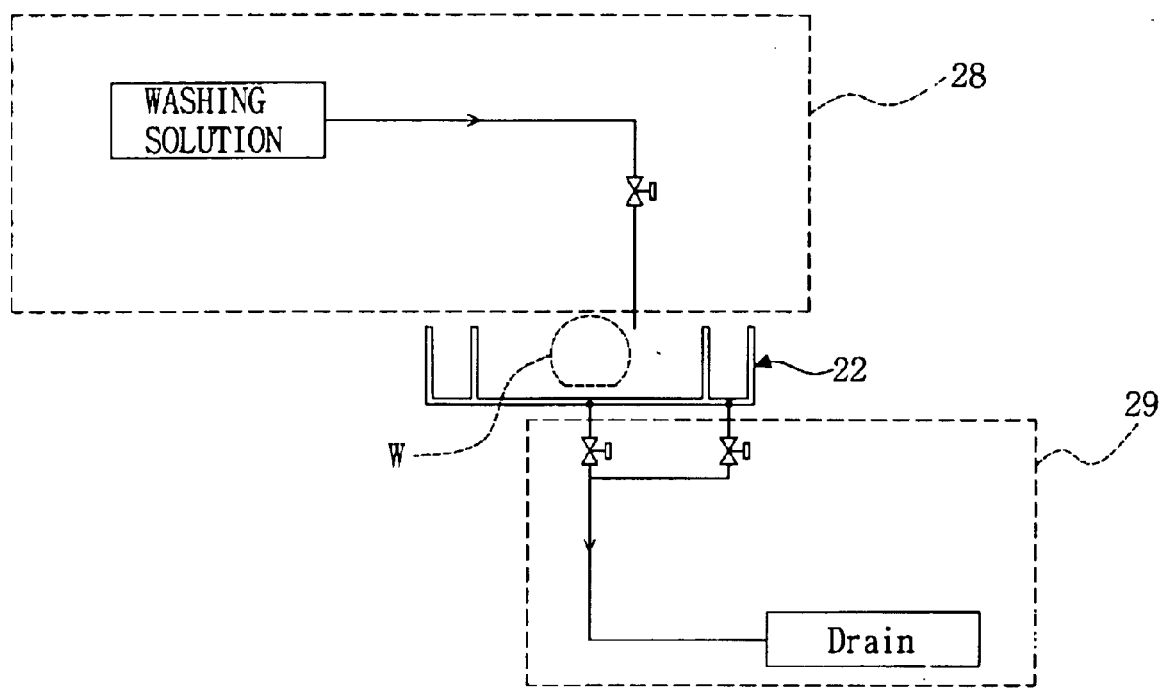
FIG. 3 is a schematic diagram of a washing system of the conventional apparatus.

The present invention will now be described with reference to FIGS. 4 through 6. Basically, the semiconductor wafer washing system includes a washing solution supply section 30 that stores each of the various chemicals making up the washing solution and controls the flow rate of the chemicals, a washing tank 32 that receives the chemicals from the washing solution supply section 30 and mixes the chemicals to make a washing solution used to wash the wafers W, a circulation section 34 for circulating the washing solution through the tank 32, and a discharge section 36 that discharges the residual chemicals and washing solution from the system.

The washing tank 32 consists of a main part A, and a supplementary part B partitioned from one another. The washing solution is stored in the main part A as the solution is being mixed with chemicals supplied from the washing solution supply part 30, and the wafers W are cleaned in the main part A in the solution. The supplementary part B contains excess washing solution overflowing from the main part A.

The circulation section 34 is connected to the washing tank 32 to circulate the washing solution through the main part A and supplementary part B of the washing tank 32. The circulation section 34 thus serves to maintain the desired characteristics of the washing solution.

The discharge section 36 is directly connected to the supply section 30, the washing tank 32 and the circulation section 34 to selectively discharge from the system the washing solution or residual chemicals from the supply section 30, washing tank 32, and circulation section 34.

The operation of the washing solution supply section 30, circulation section 34, and discharge section 36 is controlled by a controller 100.

The structure of the semiconductor wafer washing system will be explained in more detail below.

The washing solution supply section 30 comprises a plurality of chemical storage tanks 38 containing the chemicals, respectively, that are to make up the washing solution. At least one of the chemicals is pure water or a diluent for diluting the other chemicals or for preventing hardening. Each of the chemical storage tanks 38 is connected to the washing tank 32 through supply piping provided therein with at least one flow control valve V. The piping may consist of main supply pipes S, or main and branch supply pipes S, S'. A filter 40 for filtering the chemicals may be provided in any of the pipes. The filter 40 is connected to a discharge pipe D through which a portion of the chemicals or impurities filtered by the filter 40 is discharged from the system.

A flowmeter 42 is also provided in each of the supply pipes. Each flow meter 42 measures the flow rate of the chemical flowing through the pipe and outputs a signal indicative of the flow rate to the controller. The controller, in turn, controls the flow control valves V to maintain a desired flow rate of the chemicals. The flow rate of most of the chemicals can be controlled to some extent by the flow control valves V. However, the controlling of the flow rate of some exceptional chemicals or an accurate mixing of some chemicals might require the use of discrete quantitative supply apparatus 44 connected to the supply piping S, S', as shown in FIG. 5.

The quantitative supply apparatus 44 includes a quantitative mixing tank 46 connected to a chemical storage tank 38 via piping. A level sensor 48 is provided in the quantitative mixing tank 46 for measuring the amount of chemicals within the tank. The level sensor 48 also outputs a signal, indicative of the amount of chemicals within the tank 46, to the controller. The controller controls the flow control valves V in the piping connected to the quantitative mixing tank 46, thereby controlling the rate at which the chemicals flow into the tank 46.

The chemicals are typically volatile and so would evaporate if exposed to air. Hence, a cover 50 is detachably mounted to the quantitative mixing tank 46 so as to cover the tank 46 and thereby prevent a reduction in the quality of chemicals in the tank 46 that would otherwise be caused by evaporation. In addition, a source of purge gas that does not react with air, e.g. a nitride gas, is connected to the quantitative mixing tank 46 through the cover 50 by purge gas supply piping 52.

The quantitative supply apparatus 44 may also include a pump 54 provided in-line with the supply piping S, S' to pump the chemicals from the quantitative mixing tank 46 to the washing tank 32. The pump 54 is preferably a variable speed pump connected to the controller so as to generate a selected pressure in response to signals from the controller. Alternatively, the chemicals can be forced from the quantitative mixing tank 46 to the washing tank 32 by pressure generated by the purge gas supplied into the tank 46 through the purge gas supply piping 52.

In addition, the quantitative supply apparatus 44 should be connected to the discharge section 36 so that any excessive amount of chemicals can be drained from the tank 46. To this end, the discharge section 36 may comprise a first (discharge guide) drain pipe 56 extending through the cover 50 of the quantitative tank 46. The drain pipe 56 is movable up and down (FIG. 6) by a driving mechanism so that the end thereof that is located in the tank 46 may be repositioned. The end of the drain pipe 56 is set by the driving mechanism at a level corresponding to the desired level of chemicals in the tank 46, i.e., to regulate the amount of chemicals in the tank. When an excessive amount of chemicals are present in the tank 46, the flow of chemicals from the chemical tanks 38 to the washing tank 32 via the quantitative mixing tank 46 is cut off. In this state, the excess chemicals in the tank 46 are forced through the drain pipe 56 and to the drain of the discharge section 36 by pressure in the tank 46 generated by purge gas supplied to the tank 46 through the purge gas supply piping 52.

The discharge section 36 may also include a second (discharge guide) drain pipe 58 that extends through the bottom of the quantitative tank 46 and is connected to the drain of the discharge section 36. The second drain pipe 58 is also movable up and down by a driving mechanism. In the operational state that prevents the chemicals from flowing from the chemical tanks 38 to the washing tank 32 via the quantitative tank 46, excess chemicals in the quantitative tank 46 can be drained through the second drain pipe 58 by the purge gas.

The first and second drain pipes 56, 58 may be selectively used or may be used at the same time to drain chemicals from the tank 46. In addition, a pump may be provided in the first and second drain pipes 56, 58 to force the chemicals therethrough.

Figure 4:
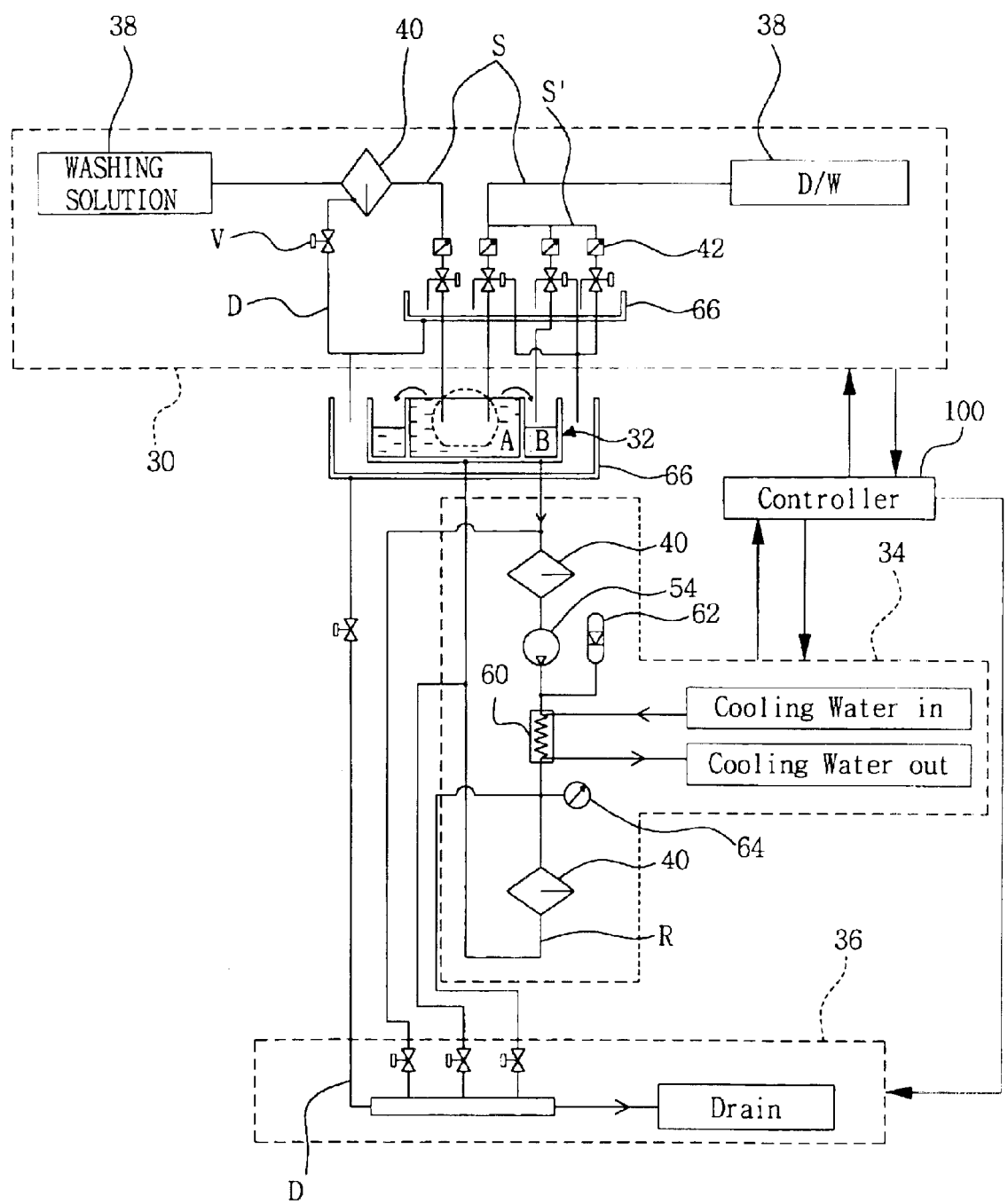
FIG. 4 is a schematic diagram of one embodiment of a washing system of semiconductor wafer washing apparatus according to the present invention.
Figure 5:
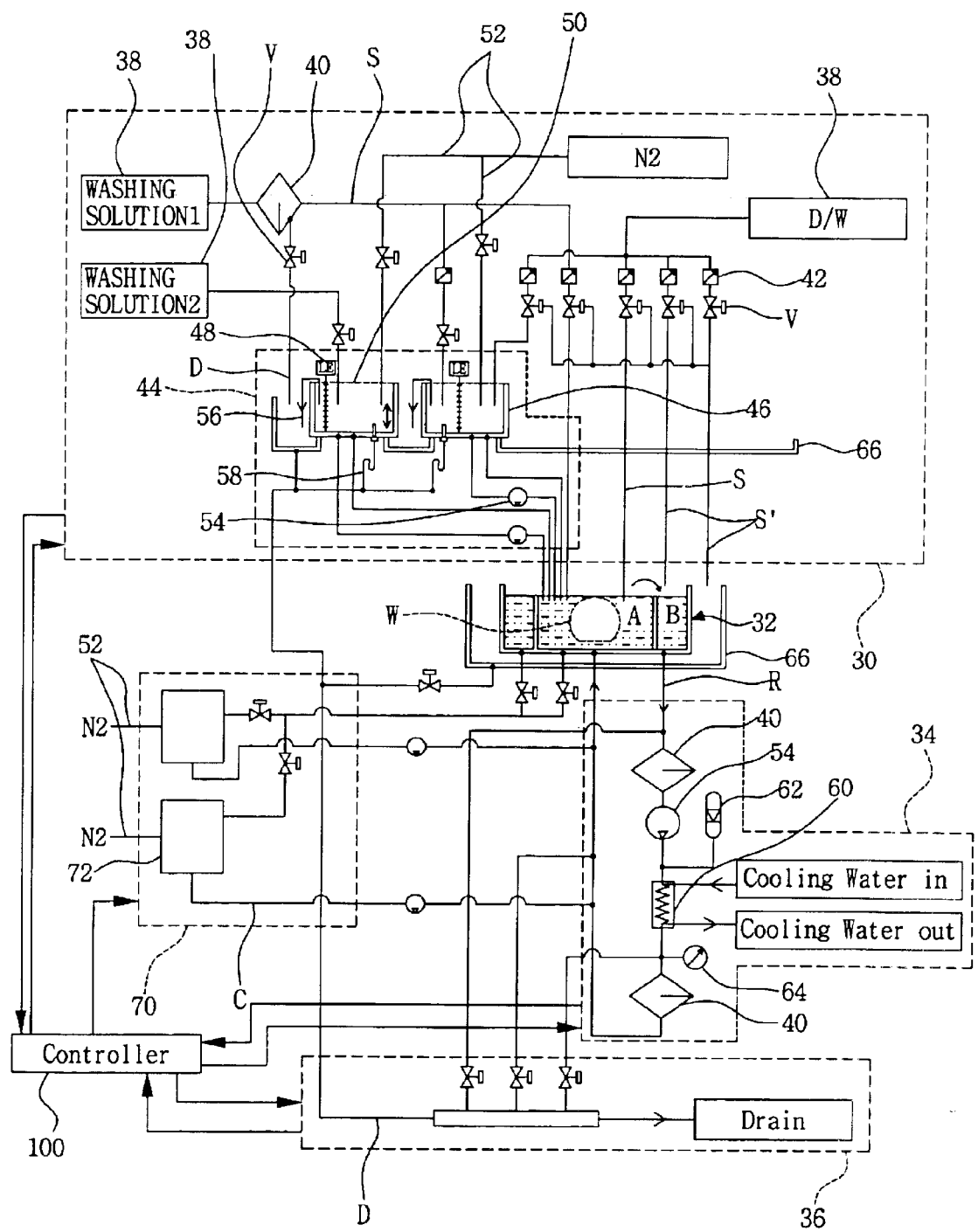
FIG. 5 is a schematic diagram of another embodiment of a washing system of semiconductor wafer washing apparatus according to the present invention.
Figure 6:
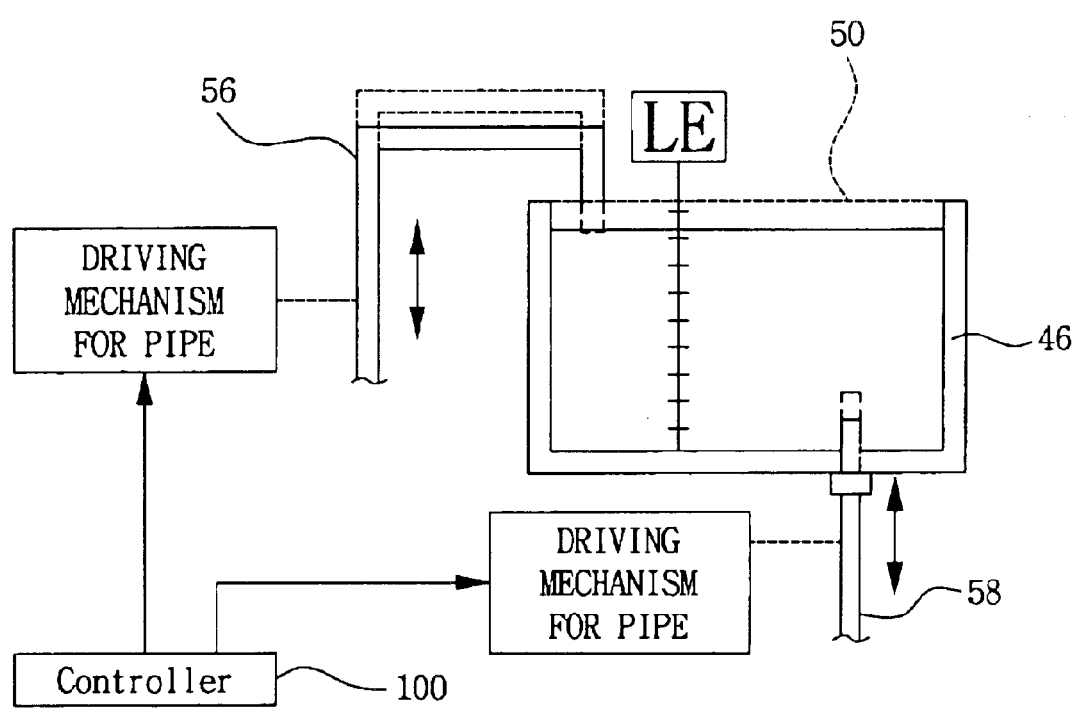
FIG. 6 is a schematic diagram of part of the washing solution supply section of the system of FIG. 5.

The circulation section 34, as shown in FIG. 4 or 5, includes circulation piping R through which the mixture of washing solution is circulated between the main part A and supplementary part B of the washing tank 32. At least one flow control valve V is provided in the circulation piping R for controlling the flow of the washing solution therethrough in response to a signal issued by the controller. Also, at least one filter 40 is provided in the circulation piping R for filtering impurities from the washing solution.

The circulation section 34 also includes a variable speed pump 54 that operates in response to a signal issued by the controller, and a pressure gauge 62 for measuring the pressure of the washing solution and outputting a signal indicative of the pressure to the controller. A check valve 64 in the circulation piping R discharges the washing solution to the discharge part 36 through discharge piping D as long as the pressure of the washing solution does not exceed a certain predetermined pressure.

In addition, the circulation section 34 may include a heat exchanger 60 operatively associated with the circulation piping R such that the temperature of the washing solution flowing through the piping R is maintained constant.

The circulation section 34 serves to condition the washing solution, e.g., to provide the correct composition and temperature. To this end, the chemicals supplied from the washing solution supply section 30 are mixed in the course of being introduced into the main part A of the washing tank 32 to form the washing solution. Excess washing solution overflows into the supplementary part B from the main part A. The controller opens the flow control valve V in the circulation piping R, and at the same time signals the pump 54 to operate, whereby the washing solution in the supplementary part B is re-circulated to the main part A.

During this time, impurities or chemicals that harden the washing solution are filtered from the washing solution by the filter 40. The pressure of the washing solution produced by the pump 54 is monitored by the pressure gage 62. The signals output by the pressure gage 62 to the controller are used to control the operation of the pump 54, whereby the pressure of the washing solution is kept within a predetermined range.

Note, the washing solution is discharged through the discharge piping D of the discharge section 36 until the pump 54 starts operating and produces a sufficient pressure.

The aforementioned operation is carried out until the chemicals are sufficiently mixed and the washing solution attains a certain temperature, whereupon the wafers W are submerged in the washing solution in the washing tank 32.

The discharge section 36 also includes at least one drain tub 66, and discharge piping D'. The residual washing solution is stored in the at least one drain tub 66 and is discharged therefrom through a pipe of the discharge piping D. A supply pipe S extends into the tub 66 from the chemical storage tank 38 in which pure water or diluent is stored. When the washing solution stored in the drain tub 66 starts to harden, the controller opens the valve V in the supply pipe extending into the tub 66 from the chemical storage tank 38 in which pure water or diluent is stored, thereby preventing the discharge piping D from being clogged with chemical precipitate of the hardened washing solution. Another pipe of the discharge piping D branches from the circulation piping R such that washing solution can be discharged from the circulation section 34. The discharge piping D is provided with valves V that are controlled by the controller to selectively discharge the washing solution from the circulation section 34.

As shown in FIG. 5, the semiconductor wafer washing system may also include a washing solution storage section 70, connected to the washing tank 32 and circulation section 34, for selectively storing washing solution having a predetermined composition. The storage section 70 includes at least one storage tank 72, connection piping C that allows the washing solution stored in the tank 72 to be reintroduced into the circulation piping R, and a valve(s) V provided in the connection piping C for controlling the flow of washing solution in response to a signal from the controller.

The storage section 70 may also comprise means for creating pressure by which the washing solution is forced from the tank 72. The means may be a source of purge gas, such as $N_2$, and a purge gas supply pipe 52 connected to the storage tank 72 and/or a variable speed pump 54 provided in the connecting pipe C. The controller controls the flow of the purge gas into the storage tank 72 to produce a certain amount of pressure therein, and controls the pump 54 as well, to thereby regulate the flow of the stored washing solution from the tank 72 and through the connection pipe C.

The purge gas supply and the pump 54 may be operated together or individually by the controller.

The washing solution storage section 70 stores washing solution that can be used when new or other wafers W require new conditions to be cleaned under.

As described above, in the semiconductor wafer washing system according to the present invention, a plurality of chemicals are separately stored in each of the chemical storage tanks 38. The chemicals are supplied to the main part A of the washing tank 32 via elements such as the flow control valves V and/or quantitative mixing tank 46.

When the chemicals are supplied via the quantitative mixing tank 46, the first and second discharge guide pipes 56, 58 are placed at predetermined positions in response to signal issued by the controller. In addition, pressure is created in the quantitative mixing tank 46 by the purge gas supply and which pressure is regulated by the controller. Still further, at least some of the chemicals are filtered by the filter 40 provided in the supply piping before the chemicals are supplied to the washing tank 32.

Thus, the chemicals are mixed together in a predetermined ratio to form the washing solution. An excess amount of the washing solution in the main part A overflows into the supplementary part B, and the excess or residual solution is recirculated back to the main part A via the recirculation section 34 to further enhance the mixing of the chemicals constituting the washing solution and so that the solution can be conditioned, e.g. temperature-conditioned, if necessary.

The controller also serves to control the flow control means of the circulation section so that the washing solution contained in the supplementary part B of the washing tank 32 is re-supplied to the main part A of the tank. At the same time, the washing solution is purified by filter 40, and is heated/cooled by heat exchanger 60. The program of the controller is designed so that the chemicals constituting the washing solution will be mixed and conditioned, e.g maintained at a given constant temperature, in accordance with the washing needs of the wafers W that are to be cleaned in the main part A of the washing tank 32.

Also, the controller serves to control the pressure of the washing solution flowing through the circulation piping R of the circulation section 34 so that the flow of the washing solution is stabilized and the pressure is appropriate for the operation of the filters 40. The pressure gauge 62 serve to measure the pressure in the section of the circulation piping R extending between the filters 40. If the pressure becomes excessive such as occurs when the filter(s) 40 become clogged, the check valve 64 opens allowing the washing solution to be discharged. That is, the check valve 64 allows the need to exchange the elements of the filters 40 to be determined.

The above-described discharge section 36 serves to temporally store (in the drain tub 66) the residual chemicals, washing solution, or impurities that are discharged from the washing solution supply section 30 and the circulation section 34. The residual chemicals, washing solution, or impurities are mixed (diluted) in the discharge section with a predetermined amount of pure water or other diluent whereupon they are discharged from the system through the discharge piping D and drain.

Now, after semiconductor wafers have been washed in the main part A of the washing tank under the operation outlined above, it may be necessary to wash other wafers using a different form of the washing solution. In this case, the washing solution is drawn from the washing tank 32 and circulation piping R through the connection piping C and into a washing solution storage tank 72. Subsequently, the controller controls the flow control means, e.g. valves V, of the washing solution supply section 30 such that the chemical(s) appropriate for washing the new wafers W are withdrawn from the respective chemical storage tank(s) 38 and are supplied to the washing tank 32. An operation similar to that described above is camed out to produce a new washing solution, i.e., to create the new environment for washing the next wafers.

However, before these next wafers are actually washed, and after the old washing solution has been stored in the washing solution storage tank 72, some of the new washing solution is supplied to and circulated through the washing tank 32 and circulation section 34 for a predetermined period of time. Then, this portion of the new washing solution is discharged. That is, the new washing solution contaminated by the remnants of the old washing solution existing in the system is discharged so that the system is clean before the new washing solution used to wash the new wafers is produced in the washing tank 32.

It may also be necessary to re-establish the original environment in which the first set of wafers were washed. In this case, the washing solution stored in the washing solution storage tank 72 is used. The other (new) washing solution is drawn from the washing tank 32 and circulation section 34 through a respective portion of the connection piping C and into another washing solution storage tank 72. Again, however, first chemicals are supplied form the washing solution supply section 30 to the washing tank 32 in a predetermined ratio conforming to that used to produce the original washing solution. This washing solution is circulated through the washing tank 32 by the circulation section for a predetermined period of time to clean the tank 32 and circulation piping R. Then, the cleaning washing solution is discharged so that the washing tank 32 and circulation section 34 remain free of the remnants of the new washing solution that was just used to wash wafers.

Conversely, the cleaning washing solution may be the original washing solution that was stored in the chemical storage tank 72. In this case, the original environment in which the first set of wafers were washed is re-established by supplying chemicals into the washing tank 32 from the washing solution supply section 30 to thereby produce the second batch of original washing solution in the washing tank 32.

As an alternative to using the washing solution for cleaning, i.e., flushing the system, as described above using either the chemicals from the washing solution supply section 30 or the washing solution from the storage tank 70, the washing solution supply section 30 may include a separate chemical storage tank 38 containing pure water or a separate washing device dedicated to the cleaning of the washing tank 32 and circulation section 34.

According to the present invention, as described above, the environment in which wafers are washed, i.e., the characteristics of the washing solution, can be easily changed in a short period of time. On the other hand, the characteristic of a particular washing solution can be maintained over a particularly long washing cycle. Still further, little washing solution is wasted when having to switch back and forth between various kinds of washing solutions. The present invention can provide each and all of these working advantages without the need to alter the set-up of the washing tanks. Accordingly, the present invention enhances the efficiency and reduces the costs currently associated with the washing of semiconductor wafers during the process of manufacturing semiconductor devices.

What is claimed is:

1. A semiconductor wafer washing system comprising:

a washing solution supply section including chemical storage tanks each containing a respective chemical for use in washing semiconductor wafers, supply piping comprising respective supply pipes extending from the tanks, and flow control means comprising at least one flow control valve disposed in said supply piping for controlling the flow of chemicals from the tanks through the supply pipes, and a filter disposed in said supply piping for filtering one of the chemicals;

a washing tank connected to said plurality of tanks of said washing solution supply section via respective portions of the supply piping thereof so as to receive chemicals from the washing solution supply section at a rate set by said flow control means, wherein a washing solution for washing wafers is formed in the washing tank;

a discharge section including a drain, and discharge piping comprising respective discharge pipes separately connecting said washing solution supply section and said washing tank to said drain, and flow control means for controlling the flow of chemicals through said discharge pipes, one of said discharge pipes being directly connected to said filter such that impurities filtered out of said one of the chemicals can be discharged to said drain from said washing solution supply section; and a controller operatively connected to said flow control means so as to issue control signals thereto that control the flow of the chemicals from said chemical tanks to said washing tank, the flow of the chemicals from said washing solution supply section to said drain as by-passing said washing tank, and the flow of chemicals from the washing tank to said drain.

2. The system as defined in claim 1, wherein said washing solution supply section further includes flow meters disposed in said supply pipes, respectively, and operatively connected to said controller so as to output to said controller signals indicative of the respective flow rates of the chemicals through said supply pipes.

3. A semiconductor wafer washing system comprising:

a washing solution supply section including chemical storage tanks each containing a respective chemical for use in washing semiconductor wafers, supply piping comprising respective supply pipes extending from the tanks, and flow control means comprising at least one flow control valve disposed in said supply piping for controlling the flow of chemicals from the tanks through the supply pipes, a mixing tank comprising a tub having an open top, and a cover covering the top of said mixing tub, a level sensor that senses the level of chemicals in the mixing tank and outputs a signal representative of the amount of chemicals in said mixing tank, a supply of purge gas, purge gas supply piping connected to said supply of purge gas and extending through said cover, a flow control valve disposed in said purge gas supply piping, and a variable speed pump operatively connected to said mixing tank;

a washing tank connected to said plurality of tanks of said washing solution supply section via respective portions of the supply piping thereof so as to receive chemicals from the washing solution supply section at a rate set by said flow control means, whereby a washing solution for washing wafers is formed in the washing tank, and wherein said mixing tank is connected to a plurality of said chemical storage tanks as interposed between said washing tank and the flow control means disposed in the supply piping extending from said plurality of chemical storage tanks;

a discharge section including a drain, and discharge piping comprising respective discharge pipes separately connecting said washing solution supply section and said washing tank to said drain, and flow control means for controlling the flow of chemicals through said discharge pipes, said flow control means of the discharge section comprising a first discharge guide pipe extending into said mixing tank from the top of the mixing tank, said first discharge guide pipe being movable up and down such that an end thereof located in said mixing tank is repositionable at different levels in said mixing tank; and a controller operatively connected to said flow control means so as to issue control signals thereto that control the flow of the chemicals from said chemical tanks to said washing tank, the flow of the chemicals from said washing solution supply section to said drain as by-passing said washing tank, and the flow of chemicals from the washing tank to said drain, and wherein said flow control valve disposed in said purge gas supply piping is operatively connected to said controller for controlling the flow of purge gas into said mixing tank via said purge gas supply piping in response to a signal outputted by said controller, said level sensor is operatively connected to said controller so as to output the signal representative of the amount of chemicals in said mixing tank to said controller, and said variable speed pump is operatively connected to said controller so as to pump the mixture of chemicals from said mixing tank at a rate corresponding to a signal outputted by said controller, whereby the flow of chemicals from said plurality of chemical storage tanks into said mixing tank is controlled by said controller in response to the signal output by said level sensor, and whereby said mixing tank receives the chemicals from said plurality of chemical storage tanks in amounts dictated by the control of said flow control means of the washing supply section by said controller such that a mixture of the chemicals having a predetermined composition can be produced in the mixing tank and supplied to said washing tank.

4. The system as defined in claim 3, wherein said flow control means of the discharge section further comprises driving means operatively connected to said first discharge guide pipe and to said controller for moving said first discharge guide pipe vertically to position the end of the first discharge guide pipe in the mixing tank in response to a signal outputted by said controller.

5. The system as defined in claim 3, wherein said flow control means of the discharge section further comprises a second discharge pipe guide extending into said mixing tank from the bottom of the mixing tank, said second discharge guide pipe being movable up and down such that an end thereof located in said mixing tank is repositionable at different levels in said mixing tank.

6. The system as defined in claim 5, wherein said flow control means of the discharge section further comprises driving means operatively connected to said first and second discharge guide pipes and to said controller for moving said discharge guide pipes vertically to position the ends of the discharge pipes in the mixing tank in response to signals outputted by said controller.

* * * * *